United States Patent
Takagi (10) Patent No.: US 11,688,653 B2
(45) Date of Patent: Jun. 27, 2023

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventor: Jun Takagi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 463 days.

(21) Appl. No.: 17/017,404

(22) Filed: Sep. 10, 2020

(65) Prior Publication Data

US 2021/0280475 A1    Sep. 9, 2021

(30) Foreign Application Priority Data

Mar. 6, 2020    (JP) .................................. 2020-039128

(51) Int. Cl.
*H01L 21/66*    (2006.01)
*H01L 21/306*    (2006.01)
*B24B 37/013*    (2012.01)

(52) U.S. Cl.
CPC ............ *H01L 22/26* (2013.01); *B24B 37/013* (2013.01); *H01L 21/30625* (2013.01)

(58) Field of Classification Search
CPC ... H01L 22/12; H01L 22/26; H01L 21/30625; B24B 37/005; B24B 37/013
See application file for complete search history.

(56) References Cited

U.S. PATENT DOCUMENTS

| 7,258,485 | B2 | 8/2007 | Nakano et al. | |
| 9,403,255 | B2 | 8/2016 | Fukushima et al. | |
| 2004/0248411 | A1* | 12/2004 | Ushio | B24B 57/02 |
| | | | | 438/689 |
| 2015/0017880 | A1 | 1/2015 | Nomura et al. | |
| 2019/0099854 | A1* | 4/2019 | Suen | B24B 37/20 |
| 2019/0344398 | A1 | 11/2019 | Watanabe | |
| 2020/0039028 | A1* | 2/2020 | Peng | B24B 37/042 |

FOREIGN PATENT DOCUMENTS

| EP | 1 017 090 A1 | 7/2000 |
| JP | 8-249727 A | 9/1996 |
| JP | 10-9801 6 A | 4/1998 |
| JP | 2006-153767 A | 6/2006 |
| JP | 2010-64220 A | 3/2010 |
| JP | 2015-16540 A | 1/2015 |
| JP | 2016-196086 A | 11/2016 |
| JP | 2019-195891 A | 11/2019 |

* cited by examiner

*Primary Examiner* — Brook Kebede
(74) *Attorney, Agent, or Firm* — Oblon, McClelland, Maier & Neustadt, L.L.P.

(57) ABSTRACT

In one embodiment, a semiconductor manufacturing apparatus includes a polisher configured to polish a film provided on a substrate. The apparatus further includes a thickness measurement module configured to measure a thickness of the film while the substrate is being conveyed before the polishing. The apparatus further includes a controller configured to control the polishing of the film by the polisher based on the thickness measured by the thickness measurement module.

20 Claims, 5 Drawing Sheets

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2020-039128, filed on Mar. 6, 2020, the entire contents of which are incorporated herein by reference.

FIELD

Embodiments described herein relate to a semiconductor manufacturing apparatus and a method of manufacturing a semiconductor device.

BACKGROUND

In a case of polishing a workpiece film provided on a substrate, if it takes a long time to measure the thickness of the workpiece film, the measurement may increase the total time required to polish the workpiece film.

DETAILED DESCRIPTION

In one embodiment, a semiconductor manufacturing apparatus includes a polisher configured to polish a film provided on a substrate. The apparatus further includes a thickness measurement module configured to measure a thickness of the film while the substrate is being conveyed before the polishing. The apparatus further includes a controller configured to control the polishing of the film by the polisher based on the thickness measured by the thickness measurement module.

Embodiments will now be explained with reference to the accompanying drawings. In FIGS. 1 to 7B, the same components are denoted by the same reference symbols and duplicate descriptions thereof will be omitted.

First Embodiment

Figure 1:
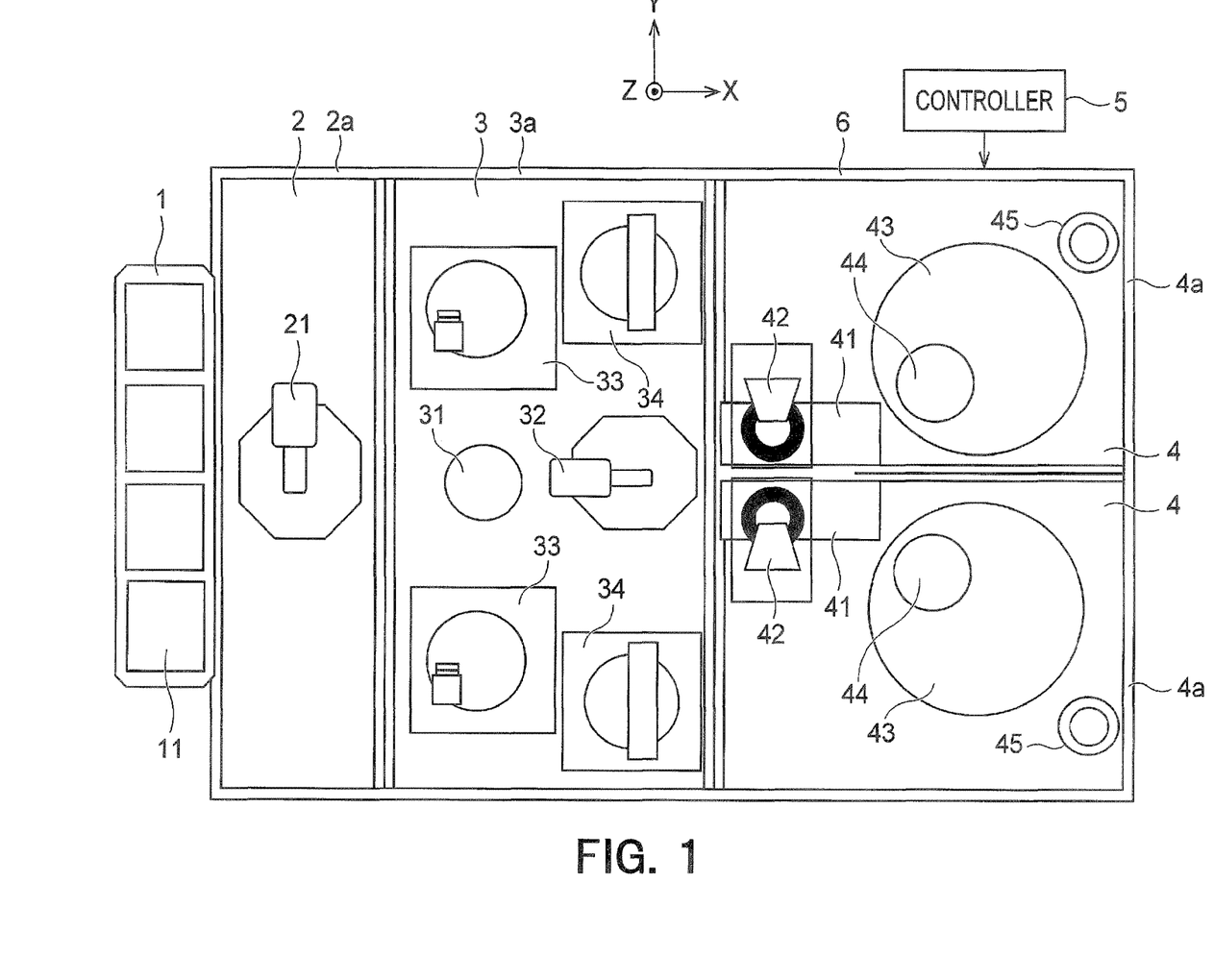
FIG. 1 is a plan view illustrating the structure of a semiconductor manufacturing apparatus of a first embodiment.

FIG. 1 is a plan view illustrating the structure of a semiconductor manufacturing apparatus of the first embodiment. The semiconductor manufacturing apparatus illustrated in FIG. 1 is, for example, a chemical mechanical polishing (CMP) apparatus.

The semiconductor manufacturing apparatus of FIG. 1 includes a front-opening unified pod (FOUP) mounting module 1, an interface module 2, a cleaner 3, two polishers 4, a controller 5 and a housing 6. The housing 6 includes an interface chamber 2a that accommodates the interface module 2, a cleaning chamber 3a that accommodates the cleaner 3, and two polishing chambers 4a that accommodate the polishers 4.

FIG. 1 illustrates X and Y directions that are parallel to an installation surface of the semiconductor manufacturing apparatus and are perpendicular to each other, and a Z direction that is perpendicular to the installation surface of the semiconductor manufacturing apparatus. In the present embodiment, +Z direction is treated as an upward direction, and −Z direction is treated as a downward direction. The −Z direction may or may not match the direction of gravity.

Figure 2A:
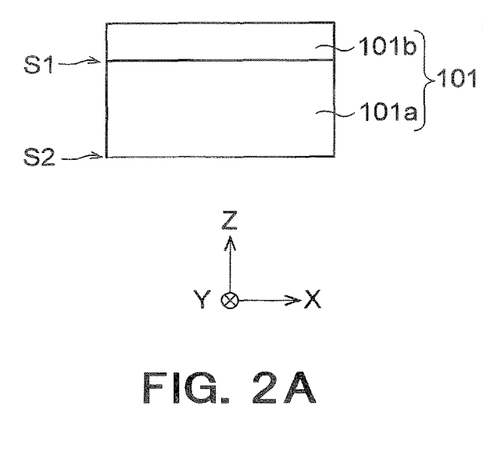
FIGS. 2A and 2B are cross-sectional views illustrating the structure of a wafer of the first embodiment.
Figure 2B:
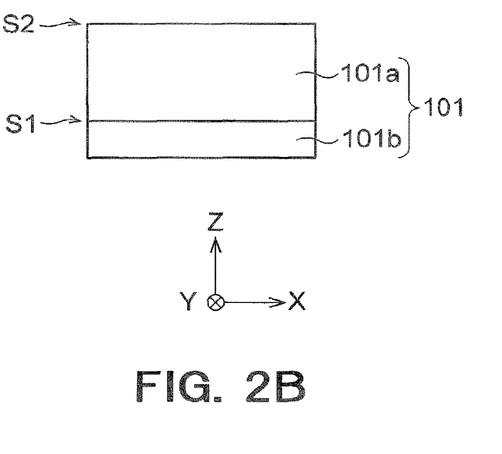
Figure 3:
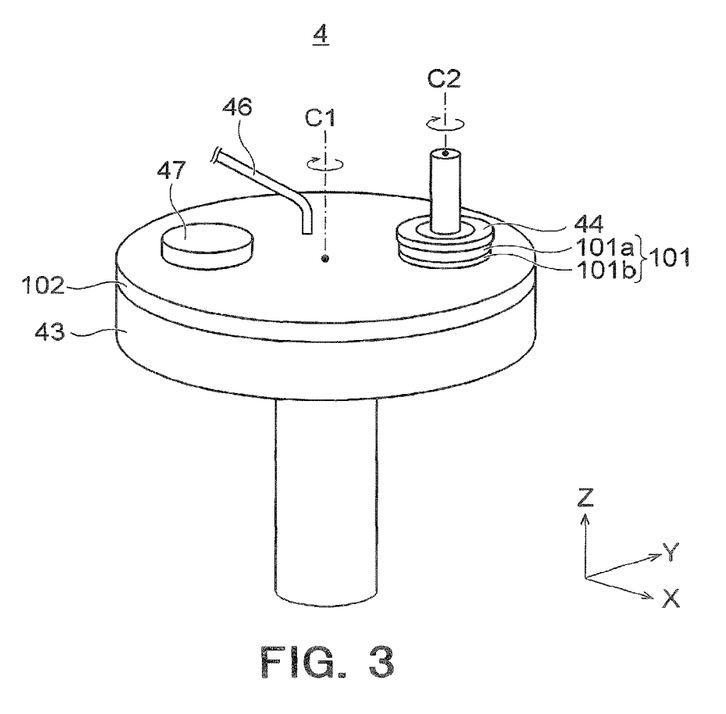
FIG. 3 is a perspective view illustrating the structure of a polisher of the first embodiment.

Hereinafter, with reference to FIG. 1, the structure of the semiconductor manufacturing apparatus of the present embodiment will be described. In the following description, FIGS. 2A to 3 will be also referred to appropriately. FIGS. 2A and 2B are cross-sectional views illustrating the structure of a wafer 101 of the first embodiment. FIG. 3 is a perspective view illustrating the structure of a polisher 4 of the first embodiment.

The FOUP mounting module 1 is provided for mounting an FOUP in which the wafer 101 is stored. The FOUP is a carrier used for conveying the wafer 101 in a factory where the semiconductor manufacturing apparatus is installed.

The FOUP mounting module 1 includes a plurality of FOUP stands 11. When the FOUP is mounted on any one of these FOUP stands 11, the wafer 101 in the FOUP is conveyed into the housing 6. FIG. 1 illustrates, as an example, four FOUP stands 11.

The wafer 101 of the present embodiment is stored in the FOUP in a state illustrated in FIG. 2A. The wafer 101 of the present embodiment includes a semiconductor wafer 101a, and a workpiece film 101b provided on the semiconductor wafer 101a. The semiconductor wafer 101a is, for example, a silicon (Si) wafer. The workpiece film 101b may be any one of a conductor film, a semiconductor film, and an insulator, but is here a metal film such as a tungsten (W) film. The workpiece film 101b may include two or more kinds of films. Further, the workpiece film 101b may be directly formed on the semiconductor wafer 101a or may be formed on the semiconductor wafer 101a via another layer. The semiconductor wafer 101a is an example of a substrate, and the workpiece film 101b is an example of a film.

FIG. 2A illustrates a front face S1 and a back face S2 of the semiconductor wafer 101a. The workpiece film 101b is provided on the front face S1 of the semiconductor wafer 101a. The wafer 101 of the present embodiment is stored in the FOUP in a state where the front face S1 faces upward, the back face S2 faces downward, as illustrated in FIG. 2A. That is, in FIG. 2A, the front face S1 is an upper face of the semiconductor wafer 101a, and the back face S2 is a lower face of the semiconductor wafer 101a. The front face S1 is an example of a first face, and the back face S2 is an example of a second face.

The interface module 2 is provided at the boundary between the interior of the housing 6 and the exterior of the housing 6, and functions as an entrance/exit of the housing 6. When the FOUP is mounted on the FOUP mounting module 1, the wafer 101 in the FOUP is conveyed via the interface module 2 into the housing 6.

The interface module 2 includes a conveyance arm 21. The conveyance arm 21 carries the unpolished wafer 101 from the FOUP into the interface module 2, conveys the wafer 101 in the interface module 2, and carries the wafer 101 from the interface module 2 into the cleaner 3. The conveyance arm 21 further carries the polished wafer 101 from the cleaner 3 to the interface module 2, conveys the wafer 101 in the interface module 2, and carries the wafer 101 out via the interface module 2 to the FOUP. The conveyance arm 21 is an example of a conveyance module.

The cleaner 3 is provided for cleaning the wafer 101. For example, the cleaner 3 cleans the wafer 101 before being polished by the polisher 4 and the wafer 101 after being polished by the polisher 4.

The cleaner 3 includes a wafer stand 31, a conveyance arm 32, two front-stage cleaning devices 33, and two rear-stage cleaning devices 34. The wafer 101 conveyed from the interface module 2 into the cleaner 3 is mounted on the wafer stand 31, is cleaned in the cleaner 3 if necessary, and is then conveyed into any one of the polishers 4. Further, the wafer 101 carried out from any one of the polishers 4 to the cleaner 3 is cleaned in the cleaner 3 if necessary, and is then mounted on the wafer stand 31 and carried out from the cleaner 3 to the interface module 2. The wafer 101 is conveyed by the conveyance arm 21 between the interface module 2 and the wafer stand 31 and is conveyed by the conveyance arm 32 in the cleaner 3 or between the wafer stand 31 and the polisher 4. The conveyance arm 32 is also an example of the conveyance module. The front-stage cleaning device 33 and the rear-stage cleaning device 34 clean the wafer 101 with mutually different cleaning fluids.

The polisher 4 is provided for polishing the wafer 101. In the present embodiment, the workpiece film 101b provided on the semiconductor wafer 101a is polished by any one of the polishers 4.

Each polisher 4 includes, as illustrated in FIG. 1, a transporter 41, a reversing module 42, a polishing table 43, a polishing head 44, and a dresser 45. Each polisher 4 further includes, as illustrated in FIG. 3, a slurry supplier 46 and a heat exchanger 47. The polishing table 43 and the polishing head 44 are also illustrated in FIG. 3.

The transporter 41 conveys the wafer 101 in a polishing chamber 4a. The reversing module 42 reverses the orientation of the wafer 101 so that the orientations of the front face S1 and the back face S2 of the semiconductor wafer 101a are reversed. The wafer 101 of the present embodiment is conveyed from the FOUP to the reversing module 42, in the state illustrated in FIG. 2A. The reversing module 42 reverses the orientation of the wafer 101 and brings the wafer 101 into the state illustrated in FIG. 2B. In the state illustrated in FIG. 2B, the wafer 101 is polished by the polisher 4. In FIG. 2B, the front face S1 is the lower face of the semiconductor wafer 101a and the back face S2 is the upper face of the semiconductor wafer 101a. The reversing module 42 further reverses the orientation of the polished wafer 101 and brings the wafer 101 into the state illustrated in FIG. 2A. The wafer 101 of the present embodiment is conveyed from the reversing module 42 to the FOUP, in the state illustrated in FIG. 2A.

The polishing table 43 holds a polishing pad 102 as illustrated in FIG. 3. The polishing head 44 holds the wafer 101 as illustrated in FIG. 3. In FIG. 3, the semiconductor wafer 101a is positioned in an upper part of the wafer 101, and the workpiece film 101b is positioned in a lower part of the wafer 101. This enables the polishing pad 102 to polish the workpiece film 101b. The dresser 45 is used to dress the upper face of the polishing pad 102. The slurry supplier 46 supplies a slurry (polishing fluid) to the upper face of the polishing pad 102. Each polisher 4 polishes the wafer 101 with the polishing pad 102 supplied with the slurry. The heat exchanger 47 is used for heating the polishing pad 102 and the slurry on the polishing pad 102.

As illustrated in FIG. 3, the polishing table 43 rotates the polishing pad 102 about a rotation axis C1, and the polishing head 44 rotates the wafer 101 about a rotation axis C2. The slurry supplier 46 supplies the slurry to the upper face of the polishing pad 102. Each polisher 4 supplies the slurry to the upper face of the polishing pad 102, rotates the polishing pad 102 and the wafer 101, and presses the lower face of the wafer 101 against the upper face of the polishing pad 102. As a result, the wafer 101 is polished by the polishing pad 102 to which the slurry has been supplied.

The controller 5 controls various operations of the semiconductor manufacturing apparatus. The controller 5, for example, controls operations of the interface module 2, the cleaner 3, and each polisher 4. An example of the controller 5 is a processor, an electric circuit, a computer, or the like.

The housing 6, as mentioned above, includes the interface chamber 2a that accommodates the interface module 2, the cleaning chamber 3a that accommodates the cleaner 3, and the two polishing chambers 4a that accommodate two polishers 4. In the present embodiment, the unpolished wafer 101 is carried from the FOUP into the housing 6, and is sequentially conveyed to the interface chamber 2a, the cleaning chamber 3a, and any one of the polishing chambers 4a. Further, in the present embodiment, the polished wafer 101 is sequentially conveyed to any one of the polishing chambers 4a, the cleaning chamber 3a, and the interface chamber 2a, and is carried out from the housing 6 to the FOUP.

The semiconductor manufacturing apparatus of the present embodiment further includes a thickness measurement module 7 described below. The thickness measurement module 7 measures the thickness of the workpiece film 101b while the wafer 101 is being conveyed in the housing 6 before polishing. Hereinafter, with reference to FIGS. 4A to 6, the thickness measurement module 7 of the present embodiment will be described in more detail.

Figure 4A:
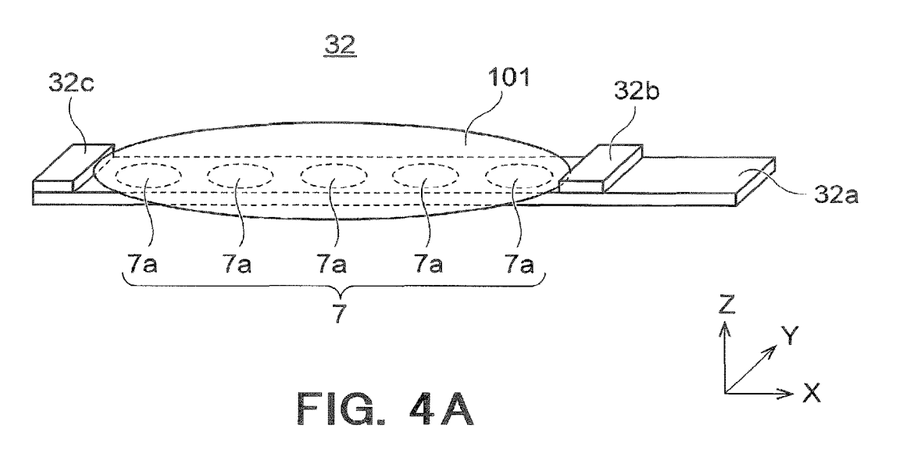
FIGS. 4A and 4B are perspective views illustrating examples of a thickness measurement module of the first embodiment.
Figure 4B:
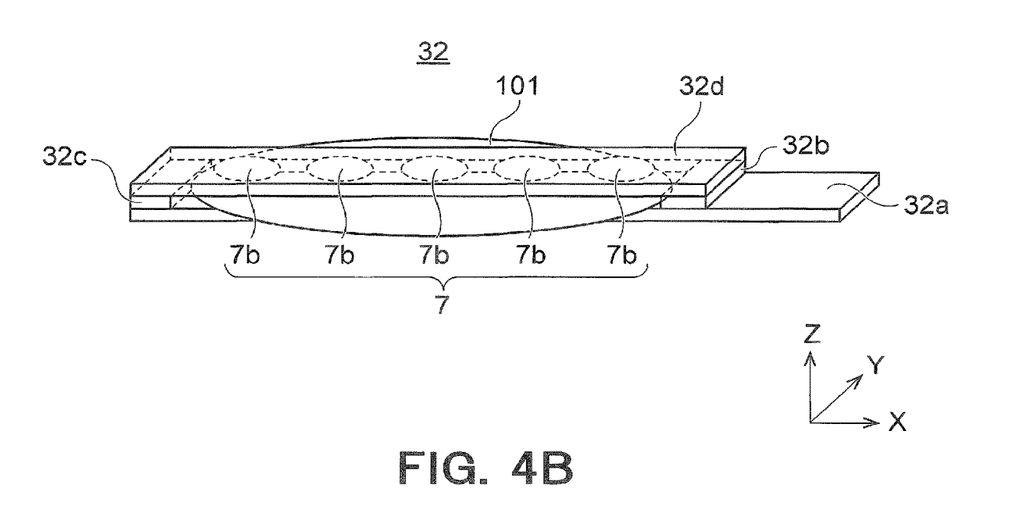

FIGS. 4A and 4B are perspective views illustrating examples of the thickness measurement module 7 of the first embodiment.

FIG. 4A illustrates an example of the conveyance arm 32 of the present embodiment. The conveyance arm 32 of this example includes a single lower plate 32a and two stopper plates 32b and 32c. The lower plate 32a has a shape capable of supporting the wafer 101. In FIG. 4A, the lower plate 32a supports the wafer 101 in a state where the lower plate 32a is in contact with the lower face of the wafer 101. The stopper plates 32b and 32c are provided on the upper face of the lower plate 32a, and function as stoppers for preventing the wafer 101 on the lower plate 32a from being positionally deviated. The conveyance arm 32 of this example can convey the wafer 101 while holding the wafer 101 with the lower plate 32a and the stopper plates 32b and 32c. The lower plate 32a is an example of a first member.

The conveyance arm 32 illustrated in FIG. 4A includes a thickness measurement module 7 provided in the lower plate 32a. The thickness measurement module 7 includes a plurality of thickness measurement devices 7a arranged in a line in the lower plate 32a. Each thickness measurement device 7a can measure the thickness of the workpiece film 101b, specifically, can measure the thickness of the workpiece film 101b at a position just above the thickness measurement device 7a. Therefore, the thickness measurement module 7 of this example can measure the thickness of the workpiece film 101b with the plurality of thickness measurement devices 7a at a plurality of portions of the workpiece film 101b.

Each thickness measurement device 7a may be a contact type that is brought into contact with the workpiece film 101b when measuring the thickness, or may be a contactless type that is not brought into contact with the workpiece film 101b when measuring the thickness. In this example, the thickness measurement device 7a is the contactless type. Further, regarding the manner for thickness measurement, each thickness measurement device 7a may be, for example, an electric resistance type (contact type), an ultrasonic type (contact type), a radiation type (contactless type), an infrared type (contactless type), a spectral interference type (contactless type), or an eddy current phase type (contactless type). In this example, the thickness measurement device 7a is the eddy current phase type. Each thickness measurement device 7a of this example is an eddy current sensor, which uses the eddy current to measure the thickness of the workpiece film 101b.

The thickness measurement module 7 illustrated in FIG. 4A measures the thickness of the workpiece film 101b while the wafer 101 is being conveyed by the conveyance arm 32 before polishing. The thickness measured by the thickness measurement module 7 is output to the controller 5 (FIG. 1). The thickness measurement module 7 of this example outputs, to the controller 5, the thicknesses measured at the plurality of locations by the plurality of thickness measurement devices 7a.

The wafer 101 of this example, after the thickness of the workpiece film 101b is measured while being conveyed by the conveyance arm 32, is conveyed into any one of the polishers 4 and is polished by the polisher 4. At this time, the controller 5 controls the polishing of the workpiece film 101b by the polisher 4, based on the thickness measured by the thickness measurement module 7. This makes it possible to polish the workpiece film 101b, in consideration of the thickness of the workpiece film 101b. For example, the workpiece film 101b can be polished much at a portion where the thickness is large and less at a portion where the thickness is small.

The controller 5 of this example sets, based on the thickness measured by the thickness measurement module 7, a polishing condition used when the polisher 4 polishes the workpiece film 101b. This makes it possible to set the polishing condition of the workpiece film 101b, in consideration of the thickness of the workpiece film 101b. For example, the wafer 101 can be strongly pressed at a portion where the thickness of the workpiece film 101b is large, and the wafer 101 can be weakly pressed at a portion where the thickness of the workpiece film 101b is small. According to this example, it is possible to acquire the thickness profile of the workpiece film 101b by the plurality of thickness measurement devices 7a. Further, it is possible to feedback control the polishing of the workpiece film 101b adequately based on the acquired thickness profile.

The semiconductor manufacturing apparatus of this example causes the thickness measurement module 7 to measure the thickness of the workpiece film 101b while the wafer 101 is being conveyed by the conveyance arm 32 before polishing. This makes it possible to shorten the time required to polish the workpiece film 101b. The reason is that, by performing the measurement of the thickness of the workpiece film 101b during conveyance of the wafer 101, the thickness can be measured without securing the time required only for the measurement of the thickness. According to this example, in the process of conveying the wafer 101, it is possible to measure the thickness of the workpiece film 101b. Therefore, it is possible to suppress a reduction in throughput of the polishing of the workpiece film 101b, and also possible to prevent the semiconductor manufacturing apparatus from increasing in size because of preparation of a place for measuring the workpiece film 101b separately from the conveyance path of the wafer 101.

This example may be applied to the conveyance arm 21 instead of the conveyance arm 32. Further, in a case where the polishing of one wafer 101 is performed a plurality of times in the semiconductor manufacturing apparatus of this example, it may be feasible to measure the thickness of the workpiece film 101b at certain timing and use the measurement result in the following polishing. Further, each thickness measurement device 7a of this example may be a contact type or a contactless type, as mentioned above. However, it is desired to use the contactless type if bringing the thickness measurement device 7a into contact with the workpiece film 101b is not preferable.

Further, each polisher 4 of this example may be replaced by a processing module that processes the workpiece film 101b in an aspect other than polishing. For example, each polisher 4 may be replaced by an etching module that processes the workpiece film 101b by dry etching or wet etching. This makes it possible to process the workpiece film 101b, in consideration of the thickness of the workpiece film 101b.

Each of the following examples will be described focusing on features different from those of the example illustrated in FIG. 4A, and the description common to that for the example illustrated in FIG. 4A will not be repeated. The description of the example illustrated in FIG. 4A is applicable to each example described below appropriately.

FIG. 4B illustrates another example of the conveyance arm 32 of the present embodiment. The conveyance arm 32 of this example includes a single lower plate 32a, two stopper plates 32b and 32c, and a single upper plate 32d. The upper plate 32d is provided on the upper faces of the stopper plates 32b and 32c, so that the wafer 101 is sandwiched between upper plate 32d and the lower plate 32a. The conveyance arm 32 of this example can convey the wafer 101 while holding the wafer 101 with the lower plate 32a, the stopper plates 32b and 32c, and the upper plate 32d. The upper plate 32d is an example of a second member.

The conveyance arm 32 illustrated in FIG. 4B includes a thickness measurement module 7 provided in the upper plate 32d. The thickness measurement module 7 includes a plurality of thickness measurement devices 7b arranged in a line in the upper plate 32d. Each thickness measurement device 7b can measure the thickness of the workpiece film 101b, specifically, can measure the thickness of the workpiece film 101b at a position just below the thickness measurement device 7b. Therefore, the thickness measurement module 7 of this example can measure, with the plurality of thickness measurement devices 7b, the thickness of the workpiece film 101b at a plurality of portions of the workpiece film 101b.

Each thickness measurement device 7b may be a contact type or a contactless type. In this example, the thickness measurement device 7b is the contact type. Further, regarding the manner for thickness measurement, each thickness measurement device 7b may be any one of the above-described manners. In this example, the thickness measurement device 7b is the electric resistance type. Each thickness measurement device 7b of this example is a sheet resistance measuring device, which measures the thickness of the workpiece film 101b based on the electric resistance.

The thickness measurement module 7 illustrated in FIG. 4B measures the thickness of the workpiece film 101b while the wafer 101 is being conveyed by the conveyance arm 32 before polishing. The thickness measured by the thickness measurement module 7 is output to the controller 5. The thickness measurement module 7 of this example outputs, to the controller 5, the thicknesses measured at the plurality of locations by the plurality of thickness measurement devices 7b. The controller 5 of this example performs operations similar to those of the example illustrated in FIG. 4A.

Figure 5:
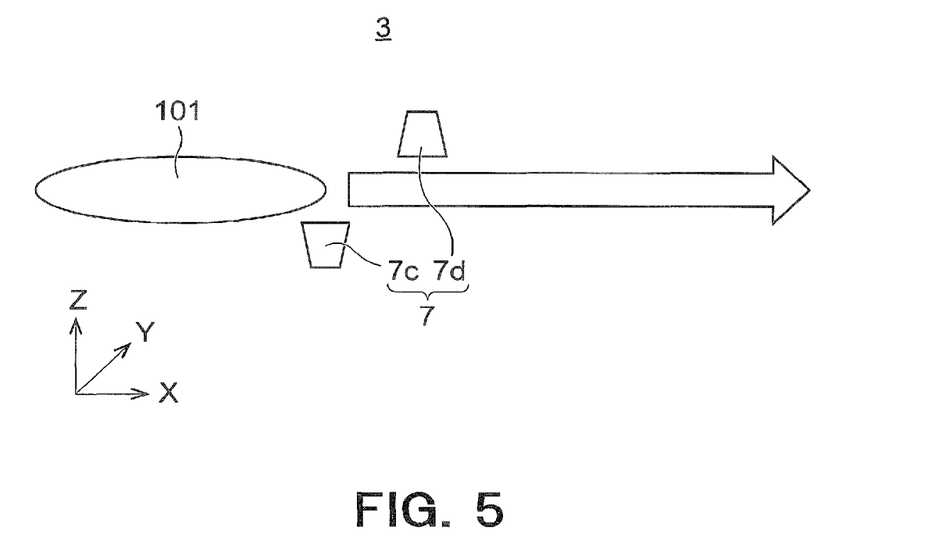
FIG. 5 is a perspective view illustrating another example of the thickness measurement module of the first embodiment.

FIG. 5 is a perspective view illustrating another example of the thickness measurement module 7 of the first embodiment.

The thickness measurement module 7 of this example is installed in the cleaning chamber 3a in which the cleaner 3 is accommodated, and is disposed near a region where the wafer 101 passes through in the cleaning chamber 3a. For example, the thickness measurement module 7 of this example is disposed near the wafer stand 31 and measures the thickness of the workpiece film 101b when the wafer 101 passes through a predetermined point near the wafer stand 31. Therefore, the thickness measurement module 7 of this example can measure the thickness while the wafer 101 is moving in the cleaning chamber 3a (for example, while the wafer 101 is being moved by the conveyance arm 32). In this example, as the above-mentioned predetermined point, only one region may be provided or a plurality of regions may be provided.

The thickness measurement module 7 of this example includes a thickness measurement device 7c located below the above-mentioned predetermined point, and a thickness measurement device 7d located above the predetermined point. Each of the thickness measurement devices 7c and 7d can measure the thickness of the workpiece film 101b. Therefore, the thickness measurement module 7 of this example can measure, with these thickness measurement devices 7c and 7d, the thickness of the workpiece film 101b at a plurality of portions of the workpiece film 101b.

The thickness measurement device 7c may be a contact type or a contactless type. In this example, the thickness measurement device 7c is the contactless type. Further, regarding the manner for thickness measurement, the thickness measurement device 7c may be any one of the above-described manners. In this example, the thickness measurement device 7c is the eddy current phase type. The same applies to the thickness measurement device 7d.

The thickness measurement module 7 of this example measures the thickness of the workpiece film 101b while the wafer 101 is being conveyed in the cleaning chamber 3a before polishing. The thickness measured by the thickness measurement module 7 is output to the controller 5. The thickness measurement module 7 of this example outputs, to the controller 5, the thicknesses measured at the plurality of locations by the plurality of thickness measurement devices 7c and 7d. The controller 5 of this example performs operations similar to those of the example illustrated in FIG. 4A.

The thickness measurement module 7 of this example may be installed at a portion other than the cleaning chamber 3a in the housing 6. For example, the thickness measurement module 7 may be provided in the interface chamber 2a or in the polishing chamber 4a.

Figure 6:
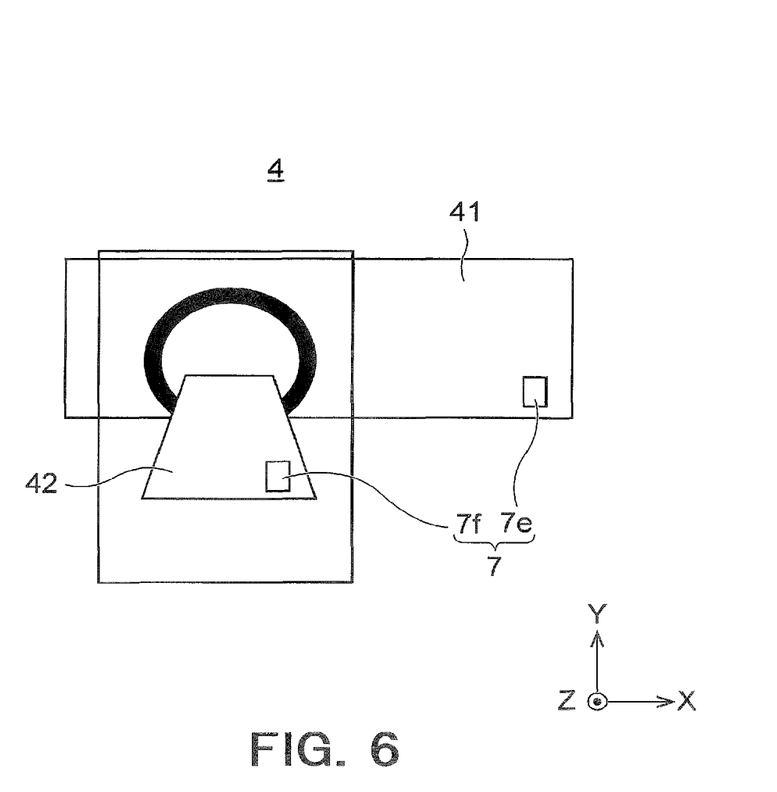
FIG. 6 is a plan view illustrating another example of the thickness measurement module of the first embodiment.

FIG. 6 is a plan view illustrating another example of the thickness measurement module 7 of the first embodiment.

FIG. 6 illustrates the transporter 41 and the reversing module 42 of the polisher 4. The thickness measurement module 7 of this example is provided in the polisher 4. Specifically, the thickness measurement module 7 includes a thickness measurement device 7e provided in the transporter 41 and a thickness measurement device 7f provided in the reversing module 42. The thickness measurement device 7e measures the thickness of the workpiece film 101b when the wafer 101 is positioned on the transporter 41 before polishing. The thickness measurement device 7f measures the thickness of the workpiece film 101b when the wafer 101 is positioned on the reversing module 42 before polishing. Therefore, the thickness measurement module 7 of this example can measure, with these thickness measurement devices 7e and 7f, the thickness of the workpiece film 101b at a plurality of portions of the workpiece film 101b.

The thickness measurement device 7e may be a contact type or a contactless type. In this example, the thickness measurement device 7e is the contactless type. Further, regarding the manner for thickness measurement, the thickness measurement device 7e may be any one of the above-described manners. In this example, the thickness measurement device 7e is the infrared type or another optical type. The same applies to the thickness measurement device 7f.

The thickness measurement module 7 of this example measures the thickness of the workpiece film 101b while the wafer 101 is being conveyed in the polishing chamber 4a before polishing. The thickness measured by the thickness measurement module 7 is output to the controller 5. The thickness measurement module 7 of this example outputs, to the controller 5, the thicknesses measured at the plurality of locations by the plurality of thickness measurement devices 7e and 7f. The controller 5 of this example performs operations similar to those of the example illustrated in FIG. 4A.

The thickness measurement module 7 of this example may include only one of the thickness measurement device 7e of the transporter 41 and the thickness measurement device 7f of the reversing module 42. Further, the thickness measurement module 7 of this example may include the transporter 41 provided with a plurality of thickness measurement devices 7e or may include the reversing module 42 provided with a plurality of thickness measurement devices 7f.

Figure 7A:
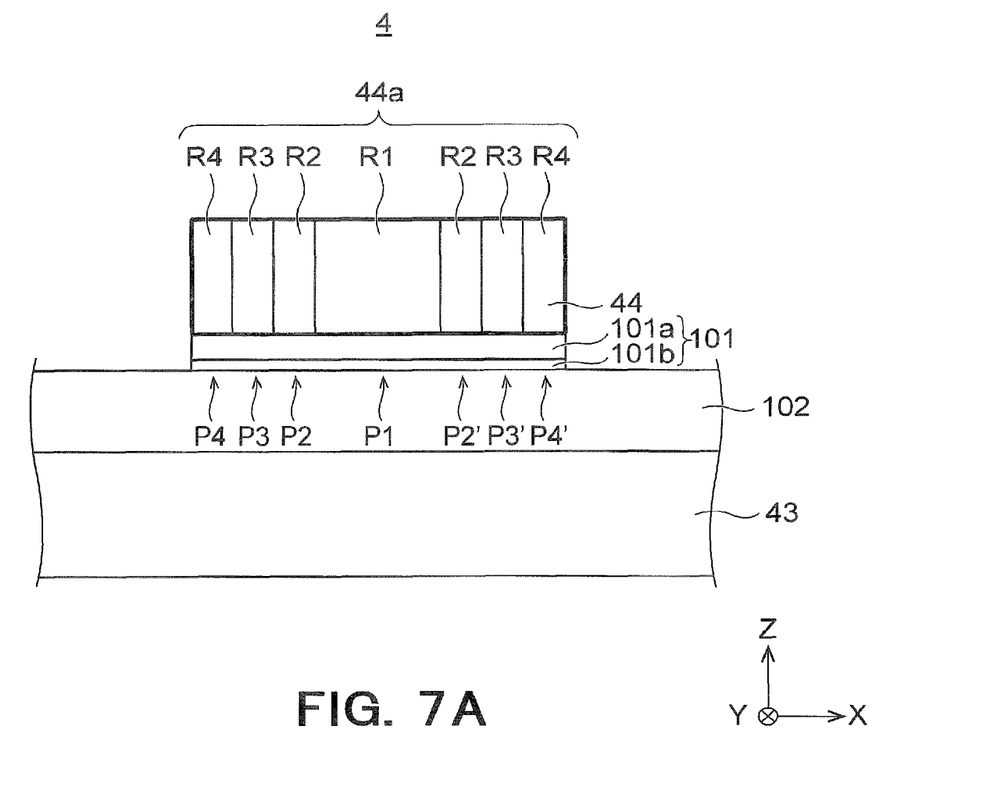
FIGS. 7A and 7B are a cross-sectional view and a plan view illustrating the structure of the polisher of the first embodiment, respectively.
Figure 7B:
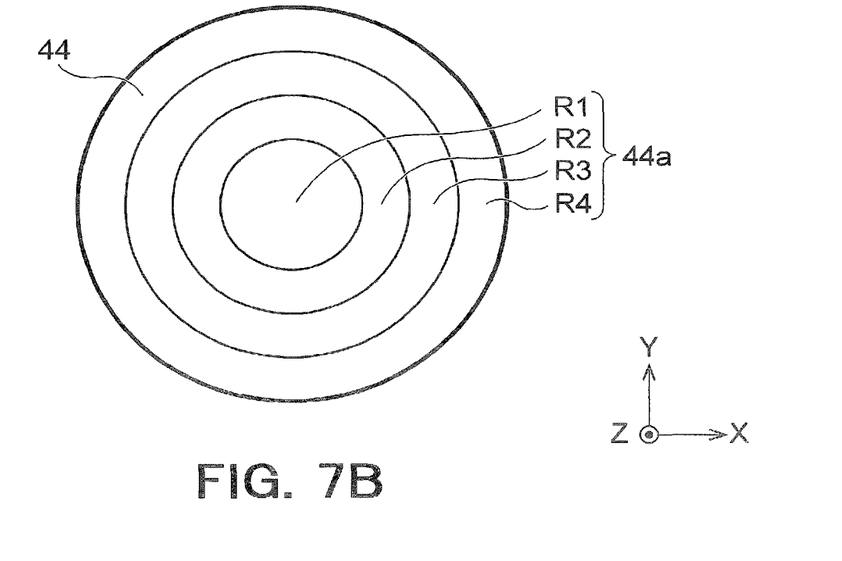

FIGS. 7A and 7B are a cross-sectional view and a plan view illustrating the structure of the polisher 4 of the first embodiment, respectively.

The polisher 4 illustrated in FIG. 7A includes the polishing head 44 provided with an airbag 44a. The polisher 4 can press, with the airbag 44a, the wafer 101 held by the polishing head 44. The airbag 44a presses the wafer 101 against the polishing pad 102. FIG. 7B illustrates a planar shape of the airbag 44a.

The airbag 44a of the present embodiment includes a plurality of (four, in this example) airbag zones R1 to R4. As illustrated in FIG. 7B, the airbag zone R1 has a circular planar shape, and each of the airbag zones R2 to R4 has an annular planar shape that concentrically surrounds the airbag zone R1. The airbag 44a has partition walls each separating mutually neighboring airbag zones.

The semiconductor manufacturing apparatus of the present embodiment includes the thickness measurement module 7 illustrated, for example, in FIG. 4A, 4B, 5 or 6. It is desired that the thickness measurement module 7 measures the thickness of the workpiece film 101b at locations whose number is equal to or greater than the number of the airbag zones R1 to R4 of the airbag 44a. Therefore, in this example, it is desired to measure the thickness of the workpiece film 101b at four or more locations.

FIG. 7A illustrates, by arrows P1 to P4, exemplary locations for measuring the thickness of the workpiece film 101b. The location indicated by the arrow P1 is a region pressed by the airbag zone R1. The location indicated by the arrow P2 is a region pressed by the airbag zone R2. The location indicated by the arrow P3 is a region pressed by the airbag zone R3. The location indicated by the arrow P4 is a region pressed by the airbag zone R4. In this example, the thickness of the workpiece film 101b is measured at one portion, for each region pressed by one airbag zone. For example, in the region pressed by the airbag zone R1, the thickness of the workpiece film 101b is measured at the location indicated by the arrow P1.

The reason why such a measuring method is adopted is as follows. The pressure of the airbag 44a according to the present embodiment is controlled for each airbag zone. Therefore, it is desired to measure the thickness of the workpiece film 101b for each airbag zone. This makes it possible to control the pressure of each airbag zone appropriately. For example, when the thickness is large at the location indicated by the arrow P1, it may be useful to adjust the pressure of the airbag zone R1 to be high.

In the present embodiment, the thickness may be measured at two or more locations in the region pressed by one airbag zone. For example, in the region pressed by the airbag zone R2, the thickness may be measured at the location indicated by the arrow P2 and a location indicated by an arrow P2'. Further, in the region pressed by the airbag zone R3, the thickness may be measured at the location indicated by the arrow P3 and a location indicated by an arrow P3'. Further, in the region pressed by the airbag zone R4, the thickness may be measured at the location indicated by the arrow P4 and a location indicated by an arrow P4'.

As mentioned above, the semiconductor manufacturing apparatus of the present embodiment includes the thickness measurement module 7 that measures the thickness of the workpiece film 101b while the wafer 101 is being conveyed before polishing. Therefore, according to the present embodiment, it is possible to shorten the time required to polish the workpiece film 101b provided on the semiconductor wafer 101a. The workpiece film 101b may be provided on a wafer made of a material other than the semiconductor or may be provided on a substrate other than the wafer.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
    a polisher configured to polish a film provided on a substrate;
    a thickness measurement module configured to measure a thickness of the film while the substrate is being conveyed before the polishing; and
    a controller configured to control the polishing of the film by the polisher based on the thickness measured by the thickness measurement module.

2. The apparatus of claim 1, wherein the thickness measurement module measures the thickness at a plurality of portions of the film.

3. The apparatus of claim 1, wherein the controller sets a polishing condition in which the polisher polishes the film, based on the thickness measured by the thickness measurement module.

4. The apparatus of claim 1, further comprising a conveyance module configured to hold and convey the substrate,
    wherein the thickness measurement module is provided in the conveyance module.

5. The apparatus of claim 4, wherein
    the conveyance module includes a first member positioned under the substrate during the conveyance of the substrate, and
    the thickness measurement module is provided in the first member.

6. The apparatus of claim 4, wherein
    the conveyance module includes a second member positioned above the substrate during the conveyance of the substrate, and
    the thickness measurement module is provided in the second member.

7. The apparatus of claim 1, wherein the thickness measurement module measures the thickness while the substrate is moving.

8. The apparatus of claim 1, wherein the thickness measurement module measures the thickness when the substrate passes through a predetermined point in the semiconductor manufacturing apparatus.

9. The apparatus of claim 1, further comprising a transporter configured to transport the substrate in a polishing chamber provided with the polisher,
    wherein the thickness measurement module is provided in the transporter.

10. The apparatus of claim 1, further comprising a reversing module configured to reverse orientations of a first face and a second face of the substrate,
    wherein the thickness measurement module is provided in the reversing module.

11. The apparatus of claim 2, wherein
    the polisher includes an airbag that presses the substrate against a polishing pad, and
    the thickness measurement module measures the thickness at the plurality of portions, a number of the portions being equal to or greater than a number of airbag zones of the airbag.

12. A method of manufacturing a semiconductor device, comprising:
    measuring a thickness of a film provided on a substrate by a thickness measurement module while the substrate is being conveyed before polishing by a polisher;
    polishing the film by the polisher; and
    controlling, by a controller, the polishing of the film by the polisher based on the thickness measured by the thickness measurement module.

13. The method of claim 12, wherein the thickness measurement module measures the thickness at a plurality of portions of the film.

14. The method of claim 12, wherein the controller sets a polishing condition in which the polisher polishes the film, based on the thickness measured by the thickness measurement module.

15. The method of claim 12, further comprising holding and conveying the substrate by a conveyance module, wherein the thickness measurement module is provided in the conveyance module.

16. The method of claim 13, wherein the polisher includes an airbag that presses the substrate against a polishing pad, and the thickness measurement module measures the thickness at the plurality of portions, a number of the portions being equal to or greater than a number of airbag zones of the airbag.

17. A semiconductor manufacturing apparatus comprising:

a processing module configured to process a film provided on a substrate;

a thickness measurement module configured to measure a thickness of the film while the substrate is being conveyed before the processing; and a controller configured to control the processing of the film by the processing module based on the thickness measured by the thickness measurement module.

18. The apparatus of claim 17, wherein the processing of the film is polishing or etching of the film.

19. A method of manufacturing a semiconductor device, comprising:

measuring a thickness of a film provided on a substrate by a thickness measurement module while the substrate is being conveyed before processing by a processing module;

processing the film by the processing module; and controlling, by a controller, the processing of the film by the processing module based on the thickness measured by the thickness measurement module.

20. The method of claim 19, wherein the processing of the film is polishing or etching of the film.

* * * * *